(12) United States Patent
Rentala et al.

(10) Patent No.: US 8,786,338 B2
(45) Date of Patent: Jul. 22, 2014

(54) DELAY LOCKED LOOP

(75) Inventors: Vijay B. Rentala, Plano, TX (US);
Srinath M. Ramaswamy, Murphy, TX (US); Brian P. Ginsburg, Allen, TX (US); Eunyoung Seok, Plano, TX (US); Baher S. Haroun, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 508 days.

(21) Appl. No.: 13/295,885

(22) Filed: Nov. 14, 2011

(65) Prior Publication Data

US 2013/0120186 A1    May 16, 2013

(51) Int. Cl.
| | |
|---|---|
| *H03L 7/06* | (2006.01) |
| *G01S 13/08* | (2006.01) |
| *H03L 7/081* | (2006.01) |
| *G01S 13/00* | (2006.01) |
| *H03L 7/089* | (2006.01) |

(52) U.S. Cl.
CPC ............ *G01S 13/00* (2013.01); *G01S 13/08* (2013.01); *H03L 7/0812* (2013.01); *H03L 7/0891* (2013.01)
USPC ............................ 327/158; 342/175; 342/194

(58) Field of Classification Search
CPC .................................................... H03L 7/0812
USPC .................................. 342/175, 194; 327/158
See application file for complete search history.

(56) References Cited

U.S. PATENT DOCUMENTS

| | | | | |
|---|---|---|---|---|
| 5,120,990 | A * | 6/1992 | Koker ................. | 327/2 |
| 6,094,078 | A | 7/2000 | Suzuki | |
| 6,667,643 | B2 * | 12/2003 | Ko ................. | 327/158 |
| 7,138,838 | B2 | 11/2006 | Shibahara et al. | |
| 7,157,949 | B2 | 1/2007 | Chen et al. | |
| 7,295,053 | B2 | 11/2007 | Lesso | |
| 7,443,761 | B2 | 10/2008 | Lin | |
| 7,595,699 | B1 | 9/2009 | Schlueter et al. | |
| 7,746,128 | B2 | 6/2010 | Kim | |
| 8,368,441 | B2 * | 2/2013 | Kato ................. | 327/156 |
| 2008/0143404 | A1 * | 6/2008 | Shim ................. | 327/158 |
| 2011/0298501 | A1 * | 12/2011 | Mosalikanti et al. ...... | 327/143 |

FOREIGN PATENT DOCUMENTS

WO    WO2009028718    3/2009

OTHER PUBLICATIONS

"Filling the THz Gap," Institute of Physics Publishing, doi:10.1088/0034-4885/69/2/R01 (Williams).
"Low-Power mm-Wave Components up to 104GHz in 90nm CMOS," ISSCC 2007, Feb. 2007, San Francisco, CA, pp. 200-201 (Heydari, et al.).

(Continued)

*Primary Examiner* — John B Sotomayor
*Assistant Examiner* — Marcus Windrich
(74) *Attorney, Agent, or Firm* — John R. Pessetto; Frederick J. Telecky, Jr.

(57) ABSTRACT

A method for providing a plurality of narrow pulses is provided. A first pulse having a first width is received by a delay line having a plurality of delay cells. This first pulse has a first width. In response to this first pulse, a plurality of second pulses is generated by the delay line, where each second pulse has a second width that is less than the first width. First and second delay pulses are also generated by the delay line, and a delay for each delay cell in the delay line can then be adjusted if a rising edge of the second delay pulse is misaligned with a falling edge of the first delay pulse.

20 Claims, 5 Drawing Sheets

(56) References Cited

OTHER PUBLICATIONS

"Millimeter-Wave CMOS Digital Controlled Artificial Dielectric Differential Mode Transmission Lines for Reconfigurable ICs," IEEE MTT-S IMS, 2008, pp. 181-184 (LaRocca, et al.).

"A 52 GHz Phased-Array Receiver Front-End in 90 nm Digital CMOS," IEEE Journal of Solid-State Circuits, vol. 43, No. 12, Dec. 2008, pp. 2651-2659 (Scheir, et al.).

"A Multi-Path Gated Ring Oscillator TDC With First-Order Noise Shaping," IEEE Journal of Solid-State Circuits, vol. 44, No. 4, Apr. 2009, pp. 1089-1098 (Straayer, et al.).

"Injection-Locked Oscillators with High-Order-Division Operation for Microwave/Millimeter-wave Signal Generation," Dissertation, Oct. 9, 2007 (Huang).

"A bidirectional TX/RX Four Element Phased-array at 60GHz with RF-IF Conversion Block in 90nm CMOS Process,"2009 IEEE Radio Frequency Integrated Circuits Symposium, pp. 207-210 (Cohen, et al.).

"A Millimeter-Wave (40-45 GHz) 16-Element Phased-Array Transmitter in 0.18-um SiGe BiCMOS Technology," IEEE Journal of Solid-State Circuits, vol. 44, No. 5, May 2009, pp. 1498-1509 (Koh, et al.).

"Injection- and Phase-Locking Techniques for Beam Control," IEEE Transactions on Microwave Theory and Techniques, vol. 46, No. 11, Nov. 1998, pp. 1920-1929 (York, et al.).

"An Integrated Subharmonic Coupled-Oscillator Scheme for a 60-GHz Phased-Array Transmitter," IEEE Transactions on Microwave Theory and Techniques, vol. 54, No. 12, Dec. 2006, pp. 4271-4280 (Buckwalter, et al.).

* cited by examiner

DELAY LOCKED LOOP

TECHNICAL FIELD

The invention relates generally to delay locked loops (DLLs) and, more particularly, to DLLs for generating narrow pulses.

BACKGROUND

Figure 1:
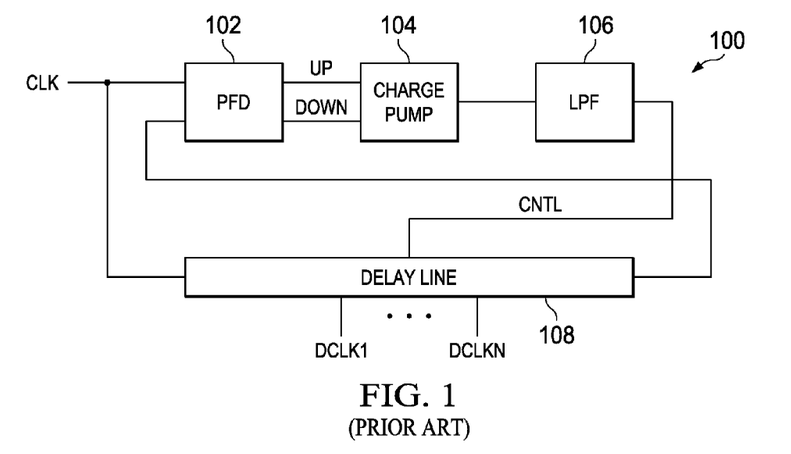
FIG. 1 is a diagram of an example of a conventional DLL.

Turning to FIG. 1, an example of a conventional DLL 100 can be seen. In operation, DLL 100 is able to generate multiple phases DCLK1 to DCLKN of clock signal from taps within delay line 108. To accomplish this, a phase/frequency detector (PFD) compares the clock signal CLK to the output from the end of the delay line 108 to generate charge pump control signals UP and DOWN. These up control signals UP and DOWN vary the charge on the loop filter or low pass filter (LPF) 106, which, in turn, varies the control signal CNTL to achieve phase lock. This DLL 100, however, is ill-suited to provide high speed, narrow pulses (i.e., 25 ps pulses spanning a 400 ps window) because of the delay used to achieve phase lock and because the DLL 100 is continuously operating even when the pulses are not used. Thus, there is a need for an improved DLL that can generate high speed, narrow pulses for applications like terahertz radar systems.

Some examples of conventional circuits are: Williams, "Filling the THz Gap," doi:10.1088/0034-4885/69/2/R01; Heydari et al., "Low-Power mm-Wave Components up to 104 GHz in 90 nm CMOS," *ISSCC* 2007, pp. 200-201, February 2007, San Francisco, Calif.; LaRocca et al., "Millimeter-Wave CMOS Digital Controlled Artificial Dielectric Differential Mode Transmission Lines for Reconfigurable ICs," IEEE MTT-S IMS, 2008; Scheir et al., "A 52 GHz Phased-Array Receiver Front-End in 90 nm Digital CMOS" *JSSC* December 2008, pp. 2651-2659; Straayer et al. "A Multi-Path Gated Ring Oscillator TDC With First-Order Noise Shaping," *IEEE J. of Solid State Circuits*, Vol. 44, No. 4, April 2009, pp. 1089-1098; Huang, "Injection-Locked Oscillators with High-Order-Division Operation for Microwave/Millimeter-wave Signal Generation," Dissertation, Oct. 9, 2007; Cohen et al., "A bidirectional TX/RX four element phased-array at 60 GHz with RF-IF conversion block in 90 nm CMOS processes," 2009 *IEEE Radio Freq. Integrated Circuits Symposium*, pp. 207-210; Koh et al., "A Millimeter-Wave (40-65 GHz) 16-Element Phased-Array Transmitter in 0.18-μm SiGe BiCMOS Technology," *IEEE J. of Solid State Circuits*, Vol. 44, No. 5, May 2009, pp. 1498-1509; York et al., "Injection- and Phase-locking Techniques for Beam Control," *IEEE Transactions on Microwave Theory and Techniques*, Vol. 46, No. 11, November 1998, pp. 1920-1929; Buckwalter et al., "An Integrated Subharmonic Coupled-Oscillator Scheme for a 60-GHz Phased Array Transmitter," *IEEE Transactions on Microwave Theory and Techniques*, Vol. 54, No. 12, December 2006, pp. 4271-4280; PCT Publ. No. WO2009028718; U.S. Pat. No. 7,157,949; and U.S. Pat. No. 7,295,053.

SUMMARY

An embodiment of the present invention, accordingly, provides an apparatus. The apparatus comprises a delay line having an input terminal, a control input terminal, a first control output terminal, a second control output terminal, and a plurality taps, wherein the delay line is configured to receive a first pulse having a first width at its input terminal, and wherein the delay line is configured to output a first delayed pulse through the first control output terminal, and wherein the delay line is configured to output a second delayed pulse through the second control output terminal, and wherein each tap is configured to output a second pulse having a second width in response to the first pulse, and wherein the first width is greater than the second width; a phase/frequency detector (PFD) that is coupled the first control output terminal and the second control output terminal so as to receive the first and second delayed pulses; a charge pump that is coupled to the PFD; and a filter that is coupled to the charge pump and the control terminal of the delay line.

In accordance with an embodiment of the present invention, the delay line further comprises: a plurality of delay cells that are coupled in series with one another in a sequence and that are each coupled to the control terminal, wherein the first delay cell of the sequence is coupled to the PFD, and wherein the last delay cell of the sequence is coupled to the PFD; and a plurality of logic gates, wherein each logic gate is coupled across at least one of the delay cells, and wherein an output terminal of each gate forms at least one of the taps.

In accordance with an embodiment of the present invention, each delay cell further comprises: an inverter having an input terminal and an output terminal; and a variable capacitor that is coupled to the output terminal of the inverter, wherein the variable capacitor is controlled by an output of the filter.

In accordance with an embodiment of the present invention, the variable capacitor further comprises a varactor.

In accordance with an embodiment of the present invention, each logic gate further comprises an AND gate.

In accordance with an embodiment of the present invention, the plurality of second pulses span the first pulse.

In accordance with an embodiment of the present invention, a method is provided. The method comprises receiving a first pulse having a first width by a delay line, wherein the first pulse has a first width, and wherein the delay line includes a plurality of delay cells; generating a plurality of second pulses by the delay line in response to the first pulse, wherein each second pulse has a second width, and wherein the first width is greater than the second width; generating first and second delay pulses by the delay line; and adjusting a delay for each delay cell in the delay line if a rising edge of the second delay pulse is misaligned with a falling edge of the first delay pulse.

In accordance with an embodiment of the present invention, the delay cells are coupled in series with one another in a sequence, and wherein the step of generating the first and second delay pulses by the delay line further comprises: outputting the first delay pulse from the first delay cell of the sequence; and outputting the second delay pulse from the last delay cell of the sequence.

In accordance with an embodiment of the present invention, the step of adjusting further comprises: comparing the rising edge of the second delay pulse is misaligned with the falling edge of the first delay pulse; generating first and second charge pump control signals to compensate for misalignment of the rising edge of the second delay pulse and the falling edge of the first delay pulse; generate a control voltage in response to the first and second charge pump control signals; and applying the control voltage to each delay cell.

In accordance with an embodiment of the present invention, the step of generating the plurality of second pulses further comprises logically combining outputs from a set of the delay cells to generate the plurality of second pulses.

In accordance with an embodiment of the present invention, the step of logically combining further comprises combining the input and output for each of the second delay cell of the sequence to the last delay cell of the sequence with one of a plurality logic gate.

In accordance with an embodiment of the present invention, each logic gate is an AND gate.

In accordance with an embodiment of the present invention, an apparatus is provided. The apparatus comprises radar circuitry that is configured to transmit and receive terahertz radiation; and a baseband circuit that is coupled to the radar circuitry so as to digitize a baseband signal, wherein the baseband circuitry includes: a in-phase (I) channel; a quadrature (Q) channel; and a clock circuit having a clock generator and a delay locked loop (DLL), wherein the DLL includes: a delay line having an input terminal, a control input terminal, a first control output terminal, a second control output terminal, and a plurality taps, wherein the delay line is configured to receive a first pulse having a first width at its input terminal from the radar circuitry, and wherein the delay line is configured to output a first delayed pulse through the first control output terminal, and wherein the delay line is configured to output a second delayed pulse through the second control output terminal, and wherein each tap is coupled to the I and Q channels so as to output a second pulse having a second width in response to the first pulse, and wherein the first width is greater than the second width; a PFD that is coupled the first control output terminal and the second control output terminal so as to receive the first and second delayed pulses; a charge pump that is coupled to the PFD; and a filter that is coupled to the charge pump and the control terminal of the delay line.

In accordance with an embodiment of the present invention, the radar circuitry further comprises: a phased array having a plurality of transceivers; a controller that is coupled to each transceiver; a distribution network that is coupled to each transceiver; a local oscillator that is coupled to the distribution network; and a pulse generator that is coupled to the local oscillator and to the input terminal of the delay line.

In accordance with an embodiment of the present invention, the baseband circuit further comprises summing circuitry that is coupled to each transceiver, the I channel, and the Q channel.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Refer now to the drawings wherein depicted elements are, for the sake of clarity, not necessarily shown to scale and wherein like or similar elements are designated by the same reference numeral through the several views.

Figure 2:
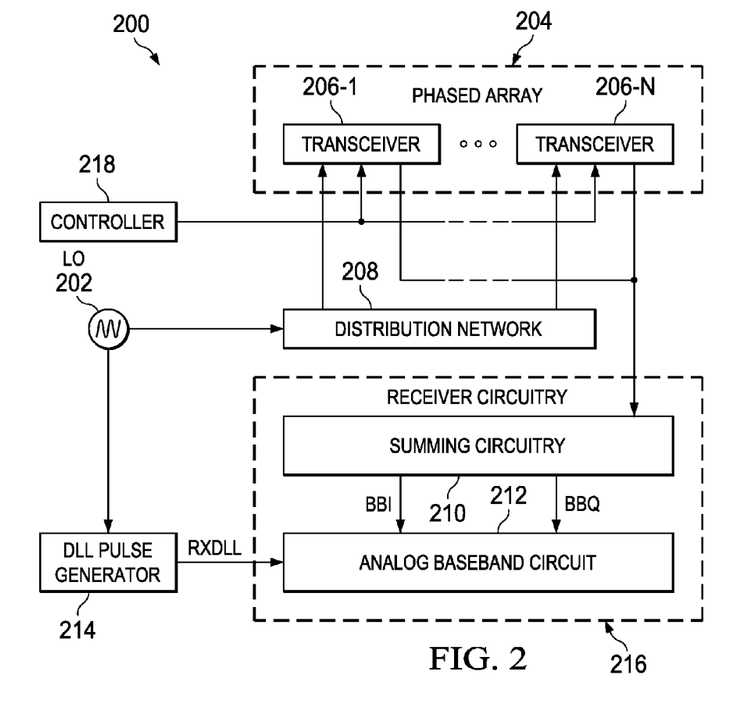
FIG. 2 is a diagram of an example of a phased array system in accordance with an embodiment of the present invention.

Turning to FIG. 2, a phased array system 200 in accordance with an embodiment of the present invention can be seen. The phase array system 200 generally comprises a local oscillator (LO) 202, a phased array 204, a distribution network 208, delay-locked loop (DLL) pulse generator 214, receiver circuitry 216, and controller 218. The phased array 204 generally comprises several transceivers 204-1 to 204-N arranged in an array that each include a radiator (i.e., patch antennas, bondwire Yagi-Uda antennas, on-package dipole, or loop antenna). The distribution network 208 generally comprises buffers or amplifiers. Additionally, the receiver circuitry 216 generally comprises summing circuitry 210 and an analog baseband circuit 216. Each of the transceivers 206-1 to 206-N, the local oscillator 202, distribution network 208, and summing circuit 210 are described in detail in co-pending U.S. patent application Ser. No. 12/878,484, entitled "TERAHERTZ PHASEDARRAY SYSTEM," filed on Sep. 9, 2010, and which is incorporated herein by reference for all purposes.

In operation, phased array system 200 (which is generally incorporated into an integrated circuit or IC) can form a short range radar system that operates in the terahertz frequency range (which is generally between 0.1 THz and 10 THz). To accomplish this, local oscillator 202 generates a local oscillator signal that is on the order of tens to hundreds of gigahertz (i.e., 40 GHz, 50 GHz, 67 GHz, 100 GHz, and 200 GHz) and a receive clock signal RXCLK. The distribution network 208 then provides the local oscillator signal to each of the transceivers 206-1 to 206-N such that the signals received by each of transceivers 206-1 to 206-N are substantially in-phase. Controller 218 provides a control signal to array 204, which phase-adjusts the transceivers 206-1 to 206-N with respect to one another to direct a beam of terahertz frequency radiation. The transceivers 206-1 to 206-N can then receive reflected radiation back from a target, which is provided to summing circuitry 210. The output of summing circuitry 210 is then converted to a digital signal by analog baseband circuit 216, which receives its timing from the DLL pulse generator 214.

Generally, this phased array system 200 has several different types of operational modes: pulsed, continuous, and stepped frequency. For a pulsed operational mode, a pulse of terahertz radiation is directed toward a target. The continuous operational mode uses a continuously generated beam. Finally, stepped frequency allows to frequency of the terahertz beam to be changed, which can be accomplished by employing a bank of local oscillators (i.e., 202). For the pulsed operational mode, in particular, the range of the system 200 is governed by the following equation:

$$R = \sqrt[4]{\sigma \frac{PG^2 \lambda n E(n)}{(4\pi)^3 kTBF\left(\frac{S}{N}\right)}},\qquad(1)$$

where:
R is distance that can be measured or range;
σ is the radar cross section of the target (usually not equal to the physical cross section);
S/N is single pulse SNR at the intermediate frequency IF filter output (envelope detector input);
kTB is the effective incoming noise power in receiver bandwidth B (B≈1/pulsewidth);
F is noise figure of the receiver (derived parameter);
P is the peak transmitter power;
G is the antenna power gain;
λ is wavelength of the radiation (i.e., for 200 GHz, ≈1.5 mm);
n is number of integrations of pulses in the receiver (multi-pulse averaging); and
E(n) is the efficiency of integration.

For a monolithically integrated, low power IC that includes system 200, this range is generally less than a few meters. Thus, it should be apparent that in the terahertz frequency range, there is a shortage of available power, which results in decreased sensitivity, and with other frequency range systems being available that have fewer limitations than terahertz systems, transmission and reception in the terahertz range usually becomes attractive when there is a large increase in available bandwidth. However, transmitting, receiving, and digitizing such large bandwidths (i.e., >10 GHz) can be problematic due at least in part on analog-to-digital converter (ADC) performance requirements.

These issues, though, are addressed in system 200. In particular, system 200 generally employs an increased pulse repetition frequency (PRF) of the terahertz radar so as to reduce coherency losses due to target motion. By making use of a high PRF, a small portion (subset) of the total available time for reception can be digitized, and by scanning this subset rapidly, it is possible to generate the full reception interval, reducing the overhead for a very high sampling frequency on the ADC. The high PRF can also generally ensure that it is possible to digitize the desired reception interval very quickly. Additionally, because of the lack of signal power, most signals should include baseband averaging of pulse reception, in system 200 some averaging is performed in the analog domain so as to reduce the ADC and digitization conversion rate to be equal to the PRF, which is an easily manageable task.

Figure 3:
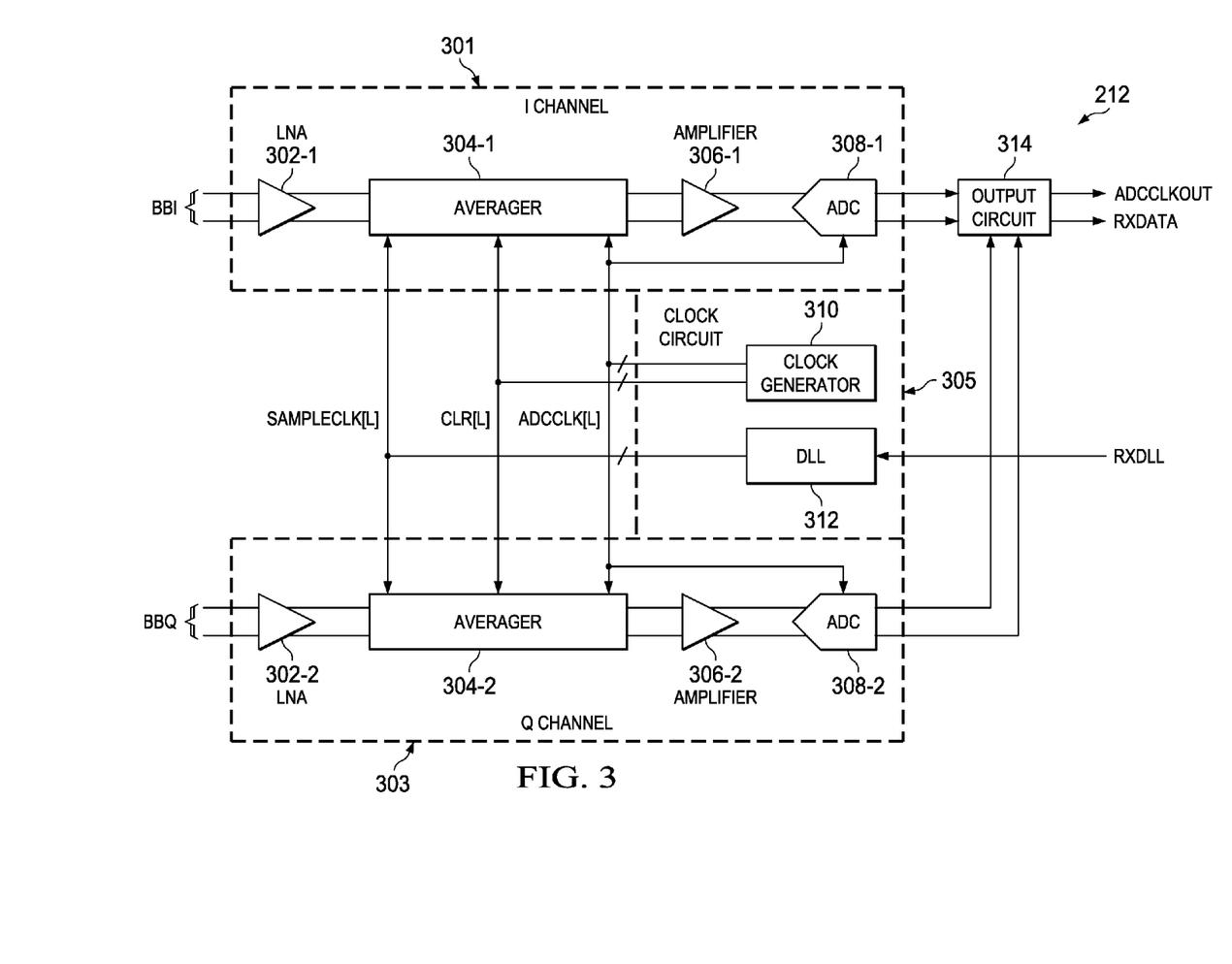
FIG. 3 is a diagram of an example of the analog baseband circuit of FIG. 2.

Turning to FIG. 3, the analog baseband circuit 216, which performs the analog averaging and digitization for system 200, can be seen in greater detail. The analog baseband circuit 216 generally comprises an in-phase or I channel 301, a quadrature or Q channel 303, a clock circuit 305, and an output circuit 314. Each of these channels 301 and 303 generally and respectively includes a low noise amplifier (LNA) 302-1 and 302-2, an averager 304-1 and 304-2, an amplifier 306-1 and 306-2, and an ADC 308-1 and 308-2. The clock circuit 305 generally comprises a clock generator 310 (which can generate an ADC clock signal ADCCLK[L] and a clear signal CLR[L]) and a DLL 312 (which can generate a sample clock signal SAMPLECLK[L]).

In operation, a digital output signal RXDATA and clock signal ADCCLKOUT are generated from the baseband input signals BBI and BBQ and DLL clock signal RXDLL. Typically, BBI and BBQ are differential signal (as shown), but may also be single-ended. These I and Q baseband signals BBI and BBQ (which are generally received from the summing circuitry 210) are respectively amplified by amplifiers 302-1 and 302-2. Because there are difficulties in digitizing the high bandwidth (as explained above), the performance requirements for ADCs 308-1 and 308-2 can be reduced by averaging the output of LNAs 302-1 and 302-1 with averagers 304-1 and 304-2. Additional details regarding the analog baseband circuit 216 can be found in co-pending U.S. patent application Ser. No. 13/085/264, entitled "ANALOG BASEBAND CIRCUIT FOR A TERAHERTZPHASED ARRAY SYSTEM," which is incorporated by reference herein for all purposes.

Figure 4:
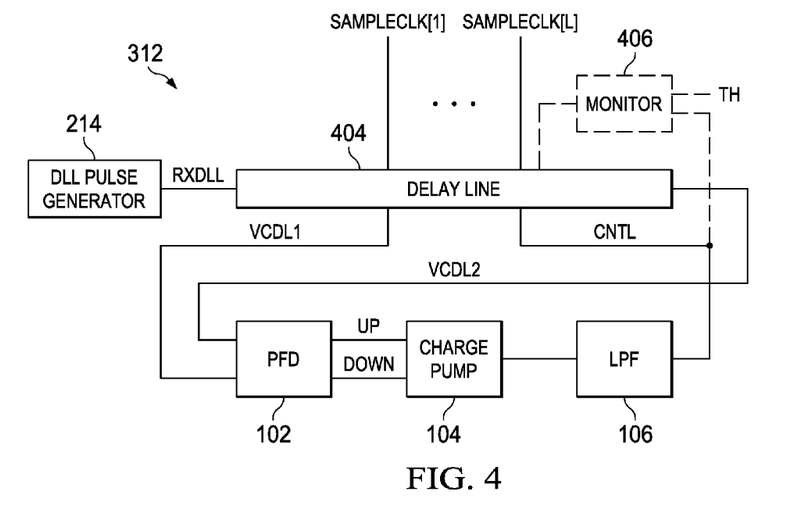
FIG. 4 is a diagram of an example of the DLL of FIG. 3.
Figure 5:
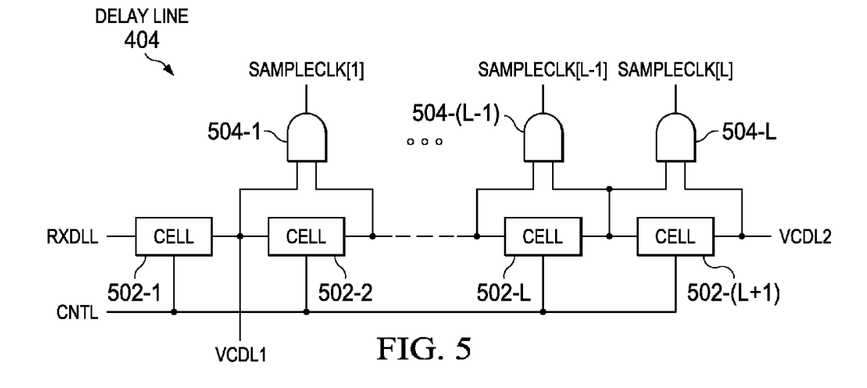
FIG. 5 is a diagram of an example of the delay line of FIG. 4.
Figure 6:
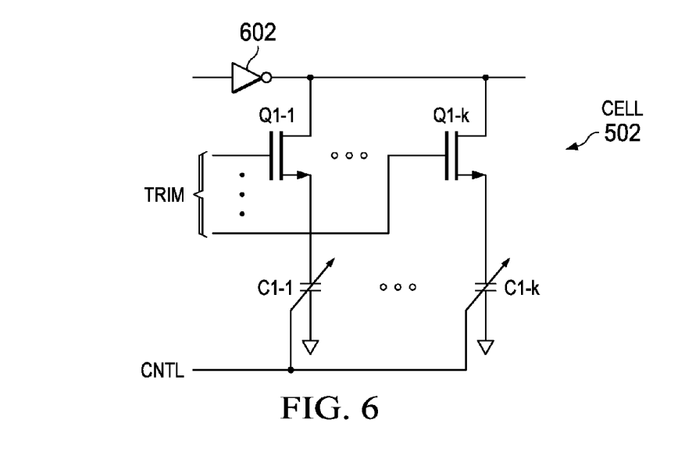
FIG. 6 is a diagram of an example of a delay cell of FIG. 5.

Generating the sample clock signal SAMPLECLK[L] using a convention DLL (i.e., DLL 100) can be problematic, so, as shown in FIGS. 4-6, DLL 312 is provided. Similar to DLL 100, DLL 312 includes PFD 102, charge pump 104, and LPF 106, but there are significant differences in functionality and delay line 404. Delay line 404 is generally comprised of cells 502-1 to 502-(L+1) arranged in a sequence such that delay signals VCDL1 and VCDL2 (which are delayed versions of the pulse from the RXDLL signal that is applied to the input terminal of the delay line 404) are output from cells 502-1 and 502-(L+1) at the control output terminals of delay line 404. Additionally, delay line 404 generally comprises AND gates 504-1 to 504-L that are each respectively coupled across cells 502-1 to 502-(L+1) to generate signals SAMPLECLK[1] to SAMPLECLK[L] at the taps of the delay line 404. Each cell 502-1 to 502-(L+1), which is labeled as 502 in FIG. 5, is generally comprised of a inverter 602 with a variable capacitor (controlled by the control voltage CNTL) coupled to its output terminal. As shown several variable capacitors C1-1 to C1-$k$ (which may be varactors) can be coupled in parallel with on another so as to be activated or trimmed (as appropriate) using the signal TRIM and transistors Q1-1 to Q1-$k$.

Figure 7:
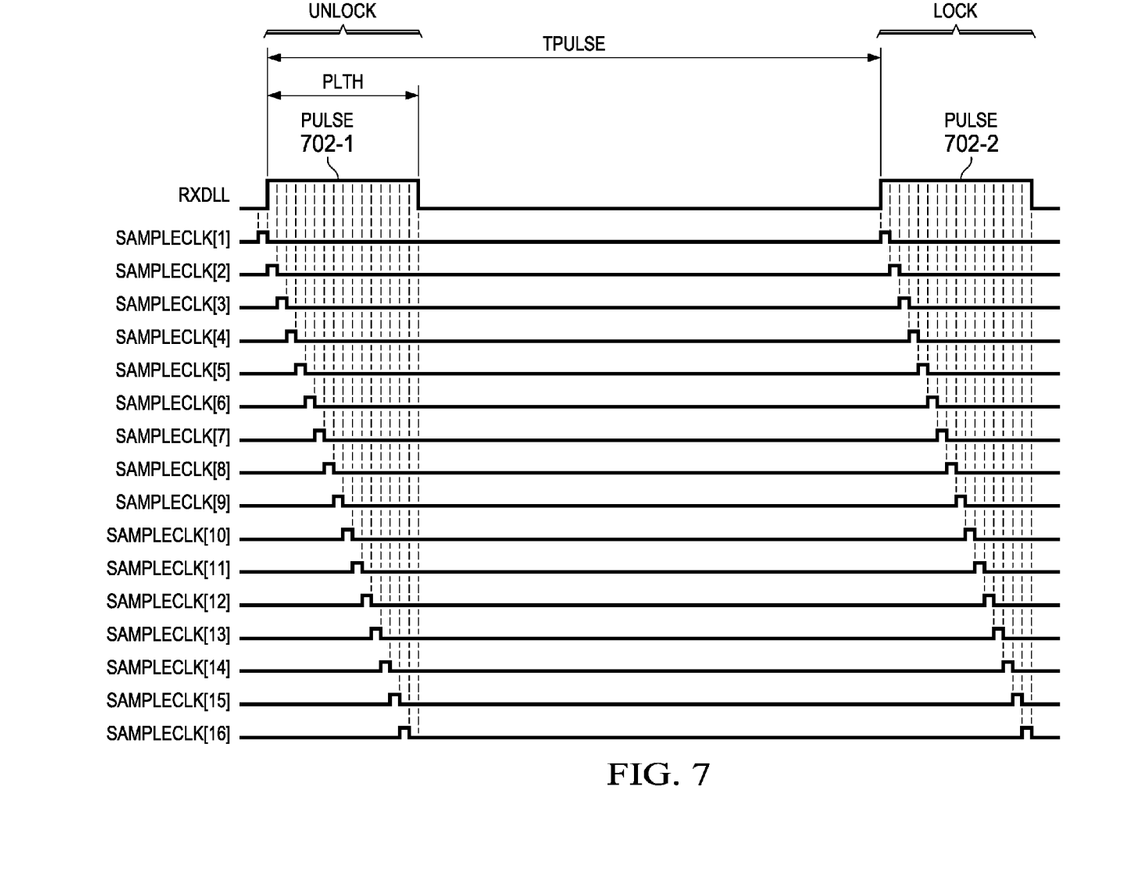
FIGS. 7 and 8 are diagram depicting the operation of the DLL of FIG. 4.
Figure 8:
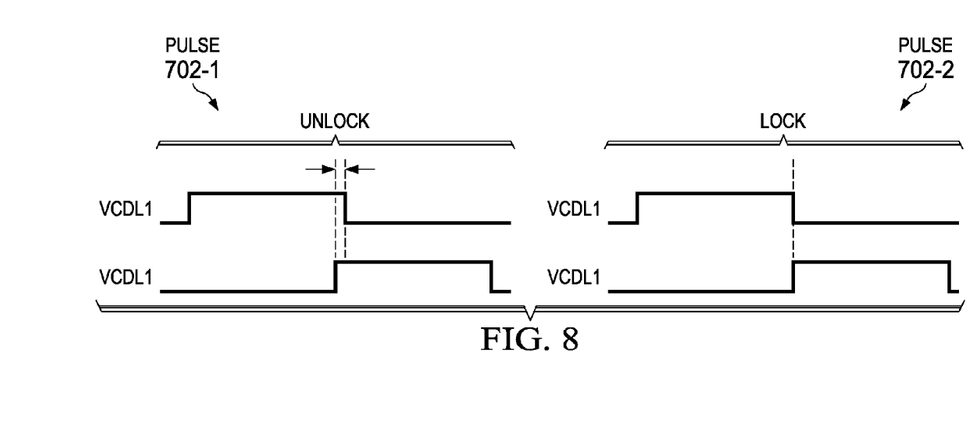

As part of the operation of the system 200, sampling occurs over a predetermined number (i.e., 16) of repeated transmitted pulses (generally in consecutive cycles) to allow the baseband signal (i.e., BBI and BBQ) to be averaged. With each transmitted pulse, there is a corresponding wide pulse (i.e., 400 ps) from DLL pulse generator 214 (on signal RXDLL). DLL 312 is able generate multiple narrow pulses (i.e., 25 ps) that are used by the I and Q channels 301 and 303 for averaging with each wide pulse on signal RXDLL. In particular, DLL 312 can achieve phase lock (as shown in FIGS. 7 and 8) by comparing delay signal VCDL1 and VCDL2 (which include delayed pulses) and making adjustments (via the control voltage CNTL) over successive (i.e., consecutive) pulses. Because each delay cell 502-1 to 502-(L+1) has a delay, the falling edge of a pulse on delay signal VCDL1 should be aligned with the rising edge of a corresponding pulse on delay signal VCDL2. Thus, by comparing the edges of corresponding pulses on the delay signals VCDL1 and VCDL2, the PFD 102 is able to determine the appropriate control signals UP and DOWN for the charge pump 104 that will enable the control voltage CNTL to be adjusted to achieve phase lock for a subsequent pulse (as shown in FIG. 7 with pulses 702-1 and 702-2 that each have a width of PLTH and period of TPULSE). This allows the AND gates 504-1 to 504-L to provide narrow pulses which can span the wide pulse; for example, for 16 AND gates 504-1 to 504-16 with each delay cell 502-1 to 502-17 having a 25 ps delay, the pulses output from AND gates 504-1 to 504-16 can span an 400 ps wide pulse (on signal RXDLL). Additionally, a monitor 406 (which can be a comparator with hysteresis and/or a power controller) can be provided to compensate for process variations. As a result, very narrow pulses can be generated without operating the delay line 404 at very high frequency, leading to significantly lower power consumption.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
a delay line having an input terminal, a control input terminal, a first control output terminal, a second control output terminal, and a plurality of taps, wherein the delay line is configured to receive a first pulse having a first width at its input terminal, and wherein the delay line is configured to output a first delayed pulse through the first control output terminal, and wherein the delay line is configured to output a second delayed pulse through the second control output terminal, and wherein each tap is configured to output a second pulse having a second width in response to the first pulse, and wherein the first width is greater than the second width;
a phase/frequency detector (PFD) that is coupled the first control output terminal and the second control output terminal so as to receive the first and second delayed pulses;
a charge pump that is coupled to the PFD; and
a filter that is coupled to the charge pump and the control terminal of the delay line.

2. The apparatus of claim 1, wherein the delay line further comprises:
a plurality of delay cells that are coupled in series with one another in a sequence and that are each coupled to the control terminal, wherein the first delay cell of the sequence is coupled to the PFD, and wherein the last delay cell of the sequence is coupled to the PFD; and
a plurality of logic gates, wherein each logic gate is coupled across at least one of the delay cells, and wherein an output terminal of each gate forms at least one of the taps.

3. The apparatus of claim 2, wherein each delay cell further comprises:
an inverter having an input terminal and an output terminal; and
a variable capacitor that is coupled to the output terminal of the inverter, wherein the variable capacitor is controlled by an output of the filter.

4. The apparatus of claim 3, wherein the variable capacitor further comprises a varactor.

5. The apparatus of claim 4, wherein each logic gate further comprises an AND gate.

6. The apparatus of claim 5, wherein the plurality of second pulses span the first pulse.

7. A method comprising:
receiving a first pulse having a first width by a delay line, and wherein the delay line includes a plurality of delay cells;
generating a plurality of second pulses by the delay line in response to the first pulse, wherein each second pulse has a second width, and wherein the first width is greater than the second width;
generating first and second delay pulses by the delay line; and
adjusting a delay for each delay cell in the delay line if a rising edge of the second delay pulse is misaligned with a falling edge of the first delay pulse.

8. The method of claim 7, wherein the delay cells are coupled in series with one another in a sequence, and wherein the step of generating the first and second delay pulses by the delay line further comprises:
outputting the first delay pulse from the first delay cell of the sequence; and
outputting the second delay pulse from the last delay cell of the sequence.

9. The method of claim 8, wherein the step of adjusting further comprises:
comparing the rising edge of the second delay pulse to see if it is misaligned with the falling edge of the first delay pulse;
generating first and second charge pump control signals to compensate for misalignment of the rising edge of the second delay pulse and the falling edge of the first delay pulse;
generate a control voltage in response to the first and second charge pump control signals; and
applying the control voltage to each delay cell.

10. The method of claim 9, wherein the step of generating the plurality of second pulses further comprises logically combining outputs from a set of the delay cells to generate the plurality of second pulses.

11. The method of claim 9, wherein the step of logically combining further comprises combining the input and output for each of the second delay cell of the sequence to the last delay cell of the sequence with one of a plurality of logic gates.

12. The method of claim 11, wherein each logic gate is an AND gate.

13. An apparatus comprising:
radar circuitry that is configured to transmit and receive terahertz radiation; and
a baseband circuit that is coupled to the radar circuitry so as to digitize a baseband signal, wherein the baseband circuitry includes:
a in-phase (I) channel;
a quadrature (Q) channel; and
a clock circuit having a clock generator and a delay locked loop (DLL), wherein the DLL includes:
a delay line having an input terminal, a control input terminal, a first control output terminal, a second control output terminal, and a plurality of taps, wherein the delay line is configured to receive a first pulse having a first width at its input terminal from the radar circuitry, and wherein the delay line is configured to output a first delayed pulse through the first control output terminal, and wherein the delay line is configured to output a second delayed pulse through the second control output terminal, and wherein each tap is coupled to the I and Q channels so as to output a second pulse having a second width in response to the first pulse, and wherein the first width is greater than the second width;
a PFD that is coupled the first control output terminal and the second control output terminal so as to receive the first and second delayed pulses;
a charge pump that is coupled to the PFD; and
a filter that is coupled to the charge pump and the control terminal of the delay line.

14. The apparatus of claim 13, wherein the delay line further comprises:
- a plurality of delay cells that are coupled in series with one another in a sequence and that are each coupled to the control terminal, wherein the first delay cell of the sequence is coupled to the PFD, and wherein the last delay cell of the sequence is coupled to the PFD; and
- a plurality of logic gates, wherein each logic gate is coupled across at least one of the delay cells, and wherein an output terminal of each gate forms at least one of the taps.

15. The apparatus of claim 14, wherein each delay cell further comprises:
- an inverter having an input terminal and an output terminal; and
- a variable capacitor that is coupled to the output terminal of the inverter, wherein the variable capacitor is controlled by an output of the filter.

16. The apparatus of claim 15, wherein the variable capacitor further comprises a varactor.

17. The apparatus of claim 16, wherein each logic gate further comprises an AND gate.

18. The apparatus of claim 17, wherein a plurality of second pulses span the first pulse.

19. The apparatus of claim 18, wherein the radar circuitry further comprises:
- a phased array having a plurality of transceivers;
- a controller that is coupled to each transceiver;
- a distribution network that is coupled to each transceiver;
- a local oscillator that is coupled to the distribution network; and
- a pulse generator that is coupled to the local oscillator and to the input terminal of the delay line.

20. The apparatus of claim 19, wherein the baseband circuit further comprises summing circuitry that is coupled to each transceiver, the I channel, and the Q channel.

* * * * *